(12) United States Patent
Peng

(10) Patent No.: US 7,666,291 B2
(45) Date of Patent: Feb. 23, 2010

(54) METHOD FOR FABRICATING METAL WIRES

(75) Inventor: Kang-Chia Peng, Tao-Yuan Hsien (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 756 days.

(21) Appl. No.: 11/162,911

(22) Filed: Sep. 28, 2005

(65) Prior Publication Data

US 2007/0068822 A1    Mar. 29, 2007

(51) Int. Cl.
*C25D 5/02*    (2006.01)
(52) U.S. Cl. .................................... 205/118; 205/125
(58) Field of Classification Search .................. 205/118, 205/125, 162, 186, 223
See application file for complete search history.

(56) References Cited

U.S. PATENT DOCUMENTS 4,640,739 A    2/1987   Modic
6,015,482 A *  1/2000   Stern ........................... 205/125
6,319,741 B1 * 11/2001  Izumi et al. .................... 438/30

FOREIGN PATENT DOCUMENTS

CN    1086372 A    5/1994
CN    1412836 A    4/2003

* cited by examiner

*Primary Examiner*—Nam X Nguyen
*Assistant Examiner*—Luan V Van
(74) *Attorney, Agent, or Firm*—Winston Hsu

(57) ABSTRACT

A method for fabricating metal wires is disclosed. A substrate is first provided, and a first metal layer is formed over the surface of the substrate. Next, a mask with patterns is formed on the surface of the substrate, in which the first metal layer is partially exposed. Next, an electroplating process is performed to form a second metal layer on top of the partially exposed first metal layer. Next, the mask with patterns is removed and an etching process is performed to remove part of the first metal layer by utilizing the second metal layer as a mask for forming a metal wire.

13 Claims, 10 Drawing Sheets

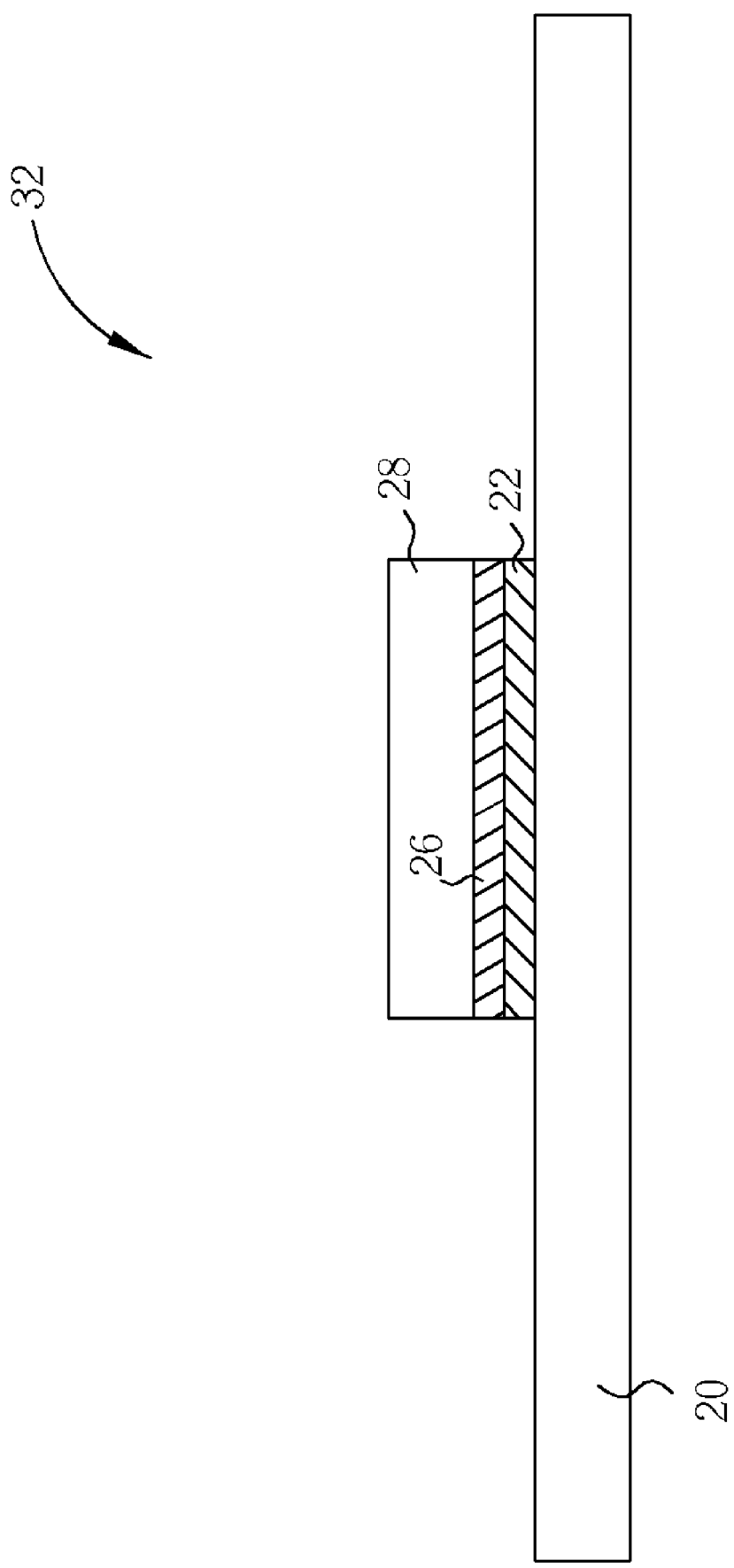

US 7,666,291 B2

METHOD FOR FABRICATING METAL WIRES

BACKGROUND OF THE INVENTION

1. Field of the Invention

The invention relates to a method of fabricating metal wires, and more particularly, to a method of increasing the uniformity of an electroplating process for fabricating metal wires with independent patterns.

2. Description of the Prior Art

As electronic product technology develops, human-machine interfaces such as displays are demanded for higher quality. Thin film transistor (TFT) liquid crystal displays (LCDs) are characterized by portability, low power consumption and lack of radiation pollution, and thus are popularly used in various portable information products such as notebooks, personal digital assistants (PDAs), digital cameras, mobile phones, et cetera.

Basically, the conventional TFT-LCD includes a thin film transistor (TFT) array substrate, a color filter, and liquid-crystal materials between the TFT array substrate and the color filter, in which the TFT array substrate includes a transparent substrate having a matrix of thin film transistors, pixel electrodes, scan lines, and signal lines orthogonal to the scan lines. With supporting electrical devices such as capacitors and connecting pads, the TFT-LCDs drive liquid-crystal-pixels to generate color-rich graphics. Hence, how to produce metal wires with strong adhesiveness and low resistance on the transparent substrate for forming the TFTs, pixel electrodes, scan lines, and signal lines described previously has become a critical task for the industry.

Please refer to FIG. 1 through FIG. 4. FIG. 1 through FIG. 4 are perspective diagrams showing the means of fabricating a metal wire 14 as described in U.S. Pat. No. 6,319,741. As shown in FIG. 1, a substrate 1 is first provided, in which the substrate 1 is a glass substrate. Next, a sputtering process is performed to form a nickel layer 2 over the surface of the substrate 1 to provide strong adhesion to the substrate 1.

As shown in FIG. 2, a photolithography and etching process (PEP) is performed to form a patterned nickel layer 12 over the surface of the substrate 1. Next, an electroless plating process is performed to form a gold layer 3 over the surface of the patterned nickel layer 12, as shown in FIG. 3. Preferably, the function of the gold layer 3 is to be utilized as a seed layer for the electroplating process performed afterwards and to prevent nickel from infiltrating to a metal layer (not shown) formed afterwards. Next, an electroplating process is performed to dispose a copper layer 4 over the surface of the gold layer 3 for forming a metal wire 14, as shown in FIG. 4.

Nevertheless, in order to fabricate the metal wire 14, the conventional method often utilizes a plurality of plating bars to connect to each metal wire 14 for connecting to a predetermined negative voltage during the electroplating process and forming a positive electrode. After the electroplating process, the plating bars are removed from each metal wire 14 to prevent short circuiting. Consequently, the fabrication of additional plating bars will significantly increase the complexity of the fabrication process and reduce the utilization area of the substrate. Due to the difficulty of using plating bars, numerous patterns are also required to be disposed over the surface of the TFT array substrate, such as drain metal patterns and electrostatic discharge devices, thereby further increasing the complexity of the process. Moreover, the uniformity of the electrical current during the electroplating process will also be greatly influenced due to inconsistent size and shape of each metal wire 14 thereby affecting the uniformity of the electroplating process.

SUMMARY OF THE INVENTION

It is therefore an objective of the present invention to provide a method of fabricating metal wires to solve the above-mentioned problems.

According to the present invention, a method for fabricating metal wires comprises: providing a substrate; forming a first metal layer over the surface of the substrate; forming a mask with patterns on the surface of the substrate and partially exposing the first metal layer; performing an electroplating process to form a second metal layer on top of the partially exposed first metal layer; removing the mask with patterns; and utilizing the second metal layer as a mask to perform an etching process to remove part of the first metal layer for forming a metal wire.

Essentially, the present invention of fabricating the metal wire utilizes the entire first metal layer to conduct electricity and improve the electroplating process by increasing the uniformity of the electrical current during the electroplating process. Additionally, the present invention also eliminates the need to fabricate an extra plating bar to connect to each metal wire, thereby facilitating the fabrication of independent patterns, such as drain metal patterns and electrostatic discharge devices, and increasing the utilization area of the substrate and reducing the complexity of the fabrication processes.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5 through FIG. 10 are perspective diagrams showing the means of fabricating metal wires according to the preferred embodiment of the present invention.

DETAILED DESCRIPTION

Figure 1:
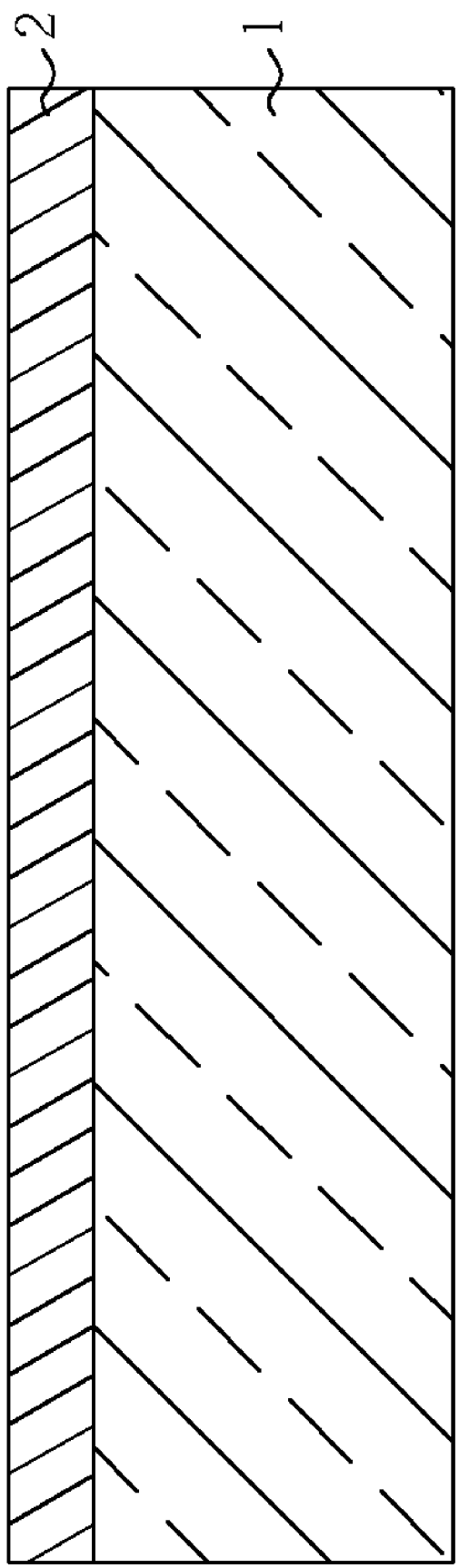
FIG. 1 through FIG. 4 are perspective diagrams showing the means of fabricating a metal wire according to the prior art.
Figure 2:
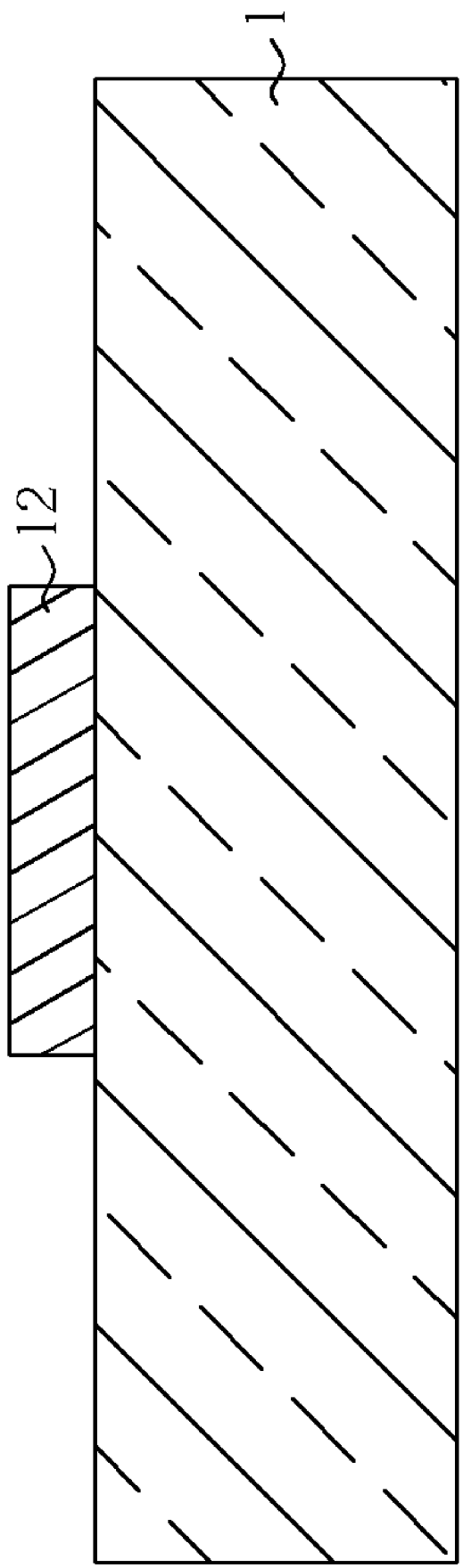
Figure 3:
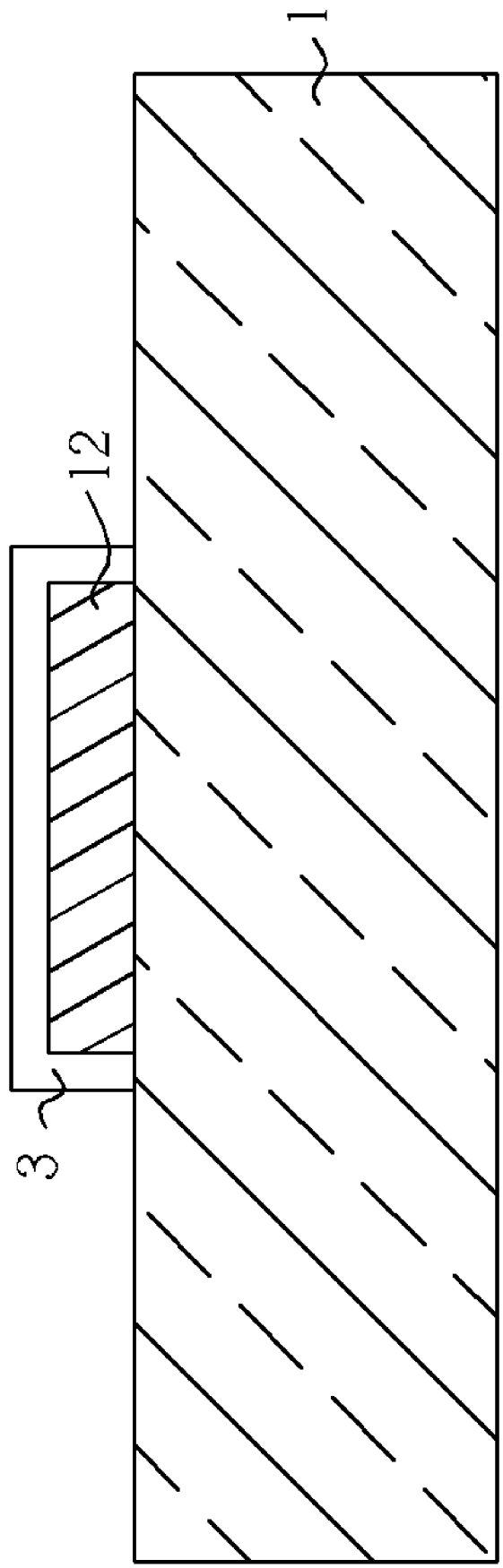
Figure 4:
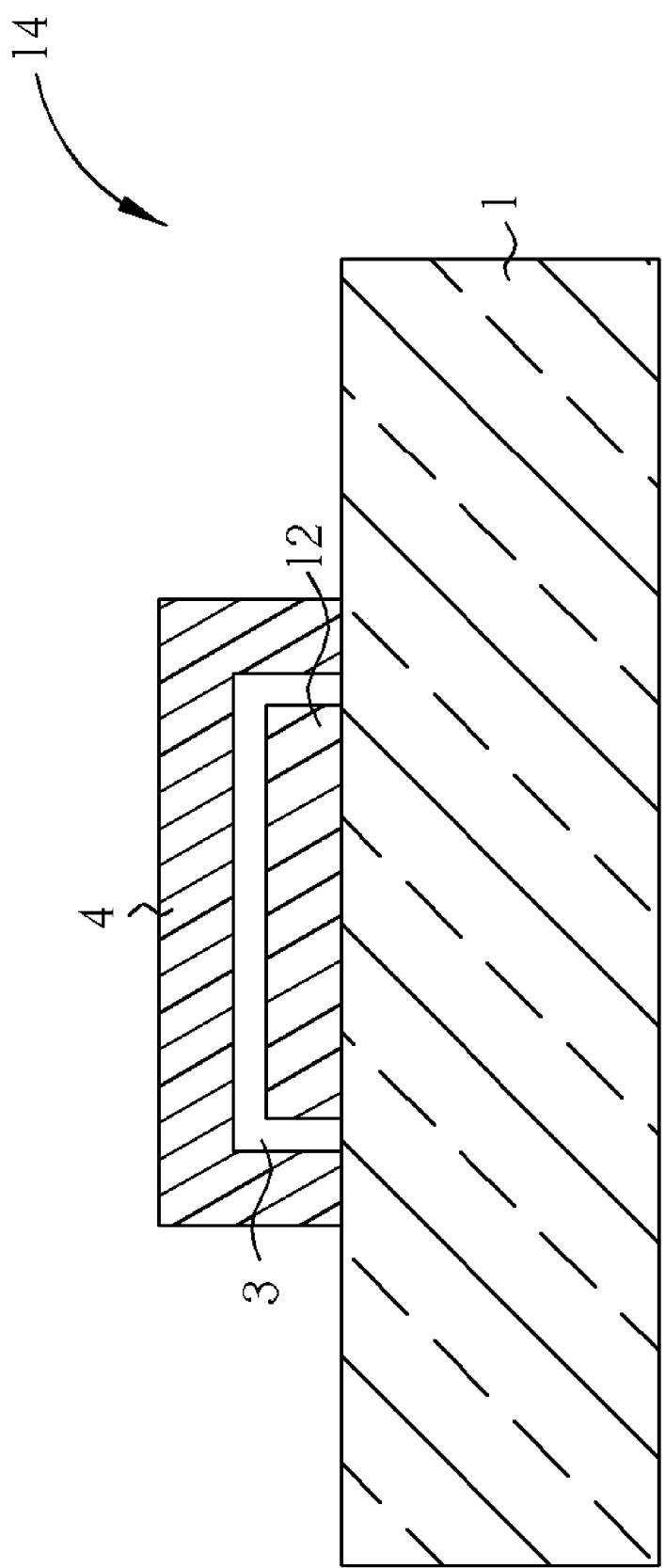
Figure 5:
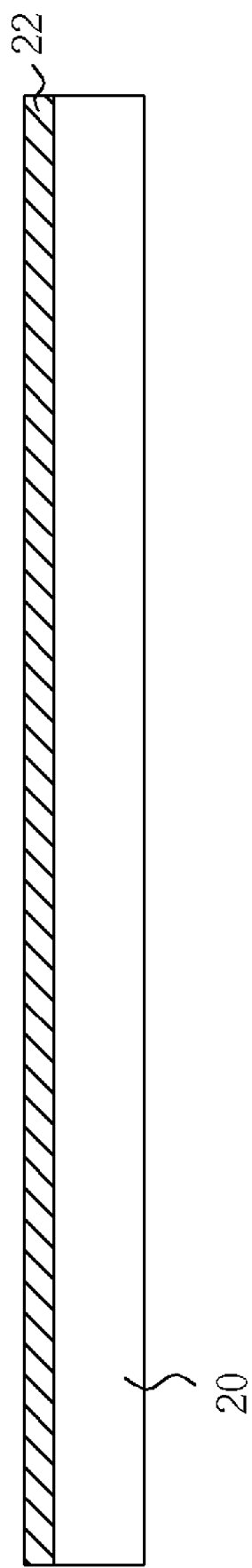

Please refer to FIG. 5 through FIG. 10. FIG. 5 through FIG. 10 are perspective diagrams showing the means of fabricating a metal wire 32 according to the preferred embodiment of the present invention. As shown in FIG. 5, a substrate 20 is first provided, in which the substrate 20 is a TFT array substrate utilized for TFT liquid crystal displays. Preferably, the substrate 20 is composed of transparent or non-transparent rigid material such as glass or quartz. Next, a first metal layer 22 is formed over the surface of the substrate 20 by utilizing a sputtering or plating process, in which the first metal layer 22 is composed of materials with strong adhesion to the substrate 20, such as nickel, tantalum, molybdenum, chromium, or aluminum.

Figure 6:
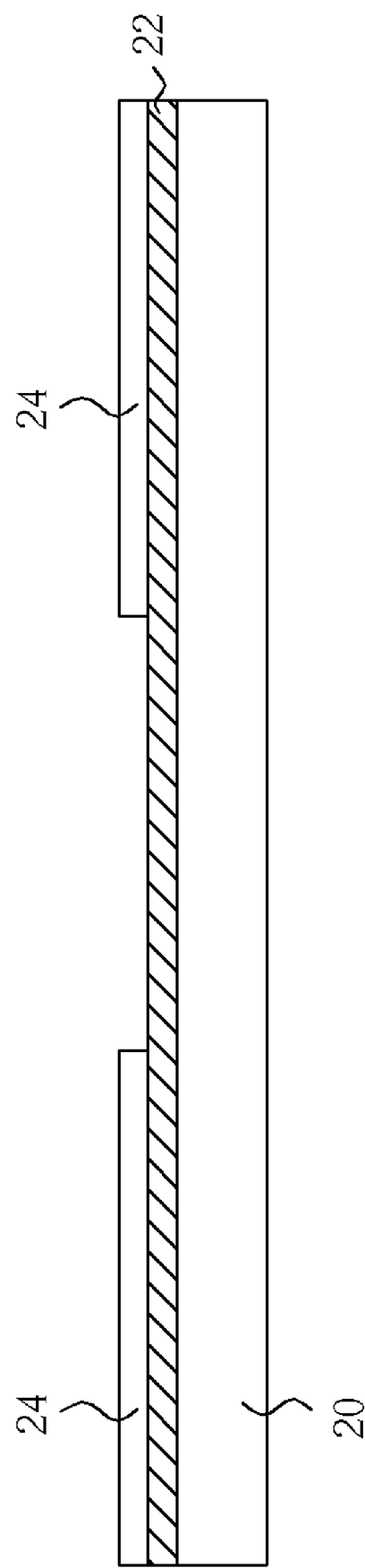

As shown in FIG. 6, a mask with patterns, such as a patterned photoresist layer 24 is formed over the surface of the substrate 20, in which the patterned photoresist layer 24 is partially disposed on the first metal layer 22 to expose part of the first metal layer 22 surface which will be formed into at least a metal wire (not shown) afterwards. Preferably, the step of forming the patterned photoresist layer 24 is performed as follows: first, a photoresist layer (not shown) is coated over the surface of the first metal layer 22; next, the photoresist layer is developed by utilizing a negative film developing process to remove the wire layout pattern which will be formed afterwards; and a photo-developing process is performed to form the patterned photoresist layer 24. According to another embodiment of the present invention, other dielectric materials including oxides and nitrides can also be utilized to form the mask with patterns, such that the fabrication flexibility of the electroplating or electroless plating process performed afterwards can be significantly increased.

Figure 7:
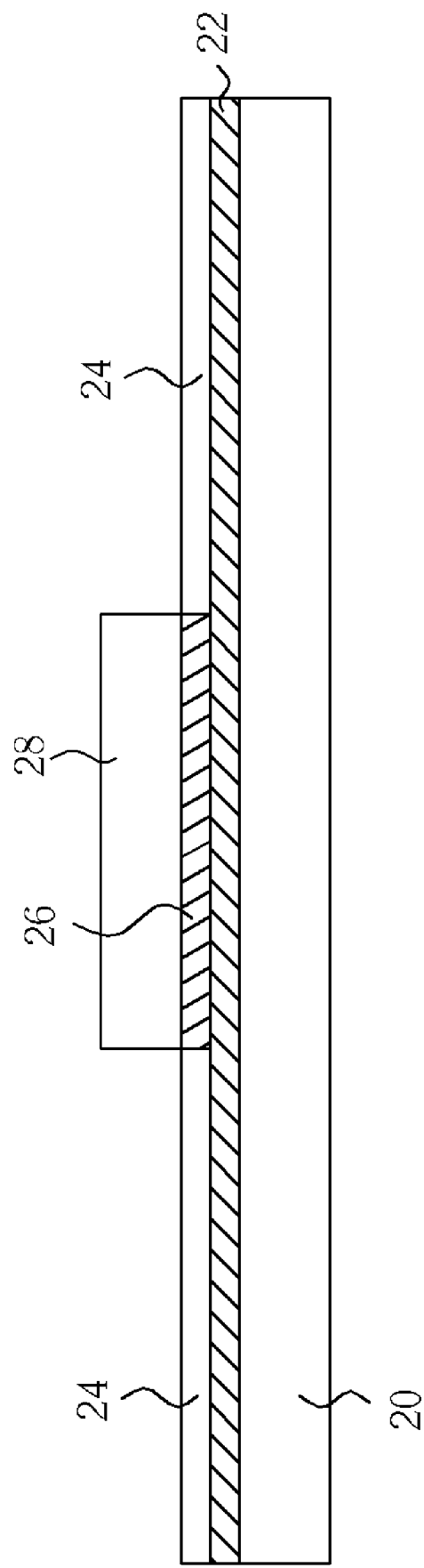

As shown in FIG. 7, an electroplating process or electroless plating process is performed to form a second metal layer 26 over the surface of the exposed first metal layer 22, in which the second metal layer 26 is composed of gold. Preferably, the second metal layer 26 is utilized as a seed layer for the electroplating process performed afterwards and to prevent the first metal layer 22 from infiltrating to the metal layer (not shown) formed afterwards. Next, the entire first metal layer 22 is conducted by a predetermined negative voltage to form a positive electrode, and an electroplating process is performed to form a third metal layer 28 over the surface of the second metal layer 26. Since the third metal layer 28 is formed by conducting the entire first metal layer 22, in which the third metal layer 28 can be composed of copper, no additional plating bar is required to be fabricated, thereby improving the uniformity of the electroplating process.

Figure 8:
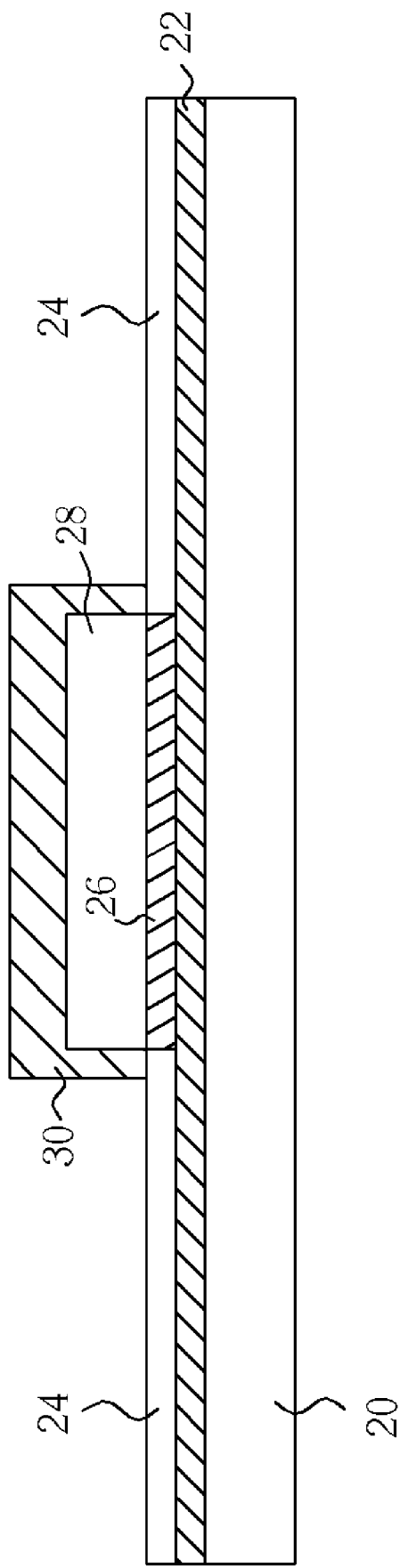

Next, a hot air solder leveling (HASL) process is performed to form a protective layer 30 over the surface of the third metal layer 28, in which the protective layer 30 is composed of tin, as shown in FIG. 8. Preferably, the protective layer 30 is formed to protect the third metal layer 28 from the damage caused by the etching process performed on the first metal layer 22. Nevertheless, if the selectivity of the etching process is adequate, the hot air solder leveling process and the tin stripping process performed afterwards can be eliminated, thereby simplifying the steps of the fabrication.

Figure 9:
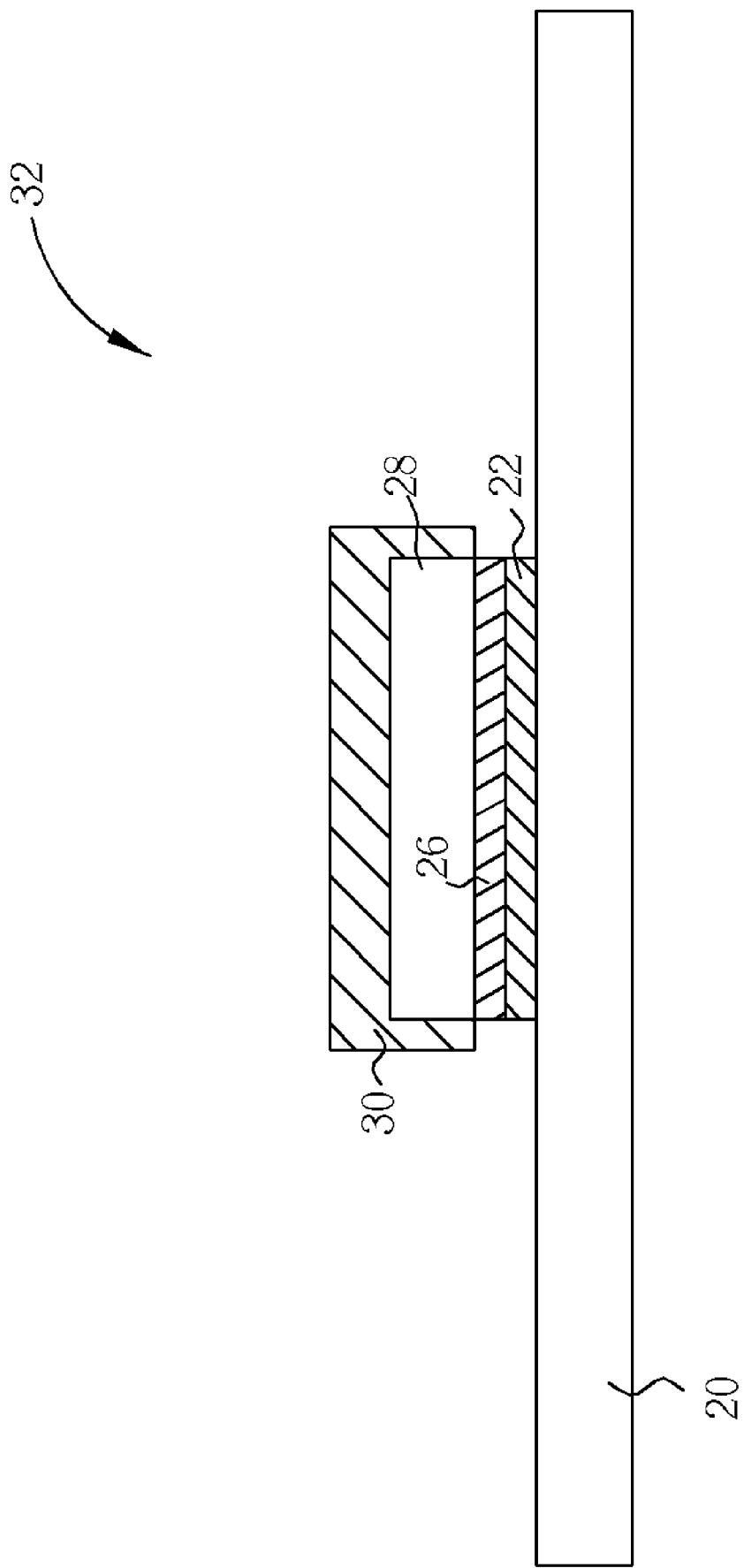

As shown in FIG. 9, the patterned photoresist layer 24 is removed and an etching process is performed to remove part of the first metal layer 22 by utilizing the protective layer 30 or the third metal layer 28 as mask to form the layout pattern of a metal wire 32. Next, a tin stripping process is performed to remove the protective layer 30 for completing the method of fabricating the metal wire 32, as shown in FIG. 10.

In contrast to the conventional method, the present invention of fabricating the metal wire 32 utilizes the entire first metal layer 22 to conduct electricity and improve the electroplating process by increasing the uniformity of the electrical current during the electroplating process. Additionally, the present invention also eliminates the need to fabricate an extra plating bar to connect to each metal wire 32, thereby facilitating the fabrication of independent patterns, such as drain metal patterns and electrostatic discharge devices, increasing the utilization area of the substrate 20 and reducing the complexity of the fabrication processes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating metal wires comprising:
    providing a substrate;
    forming a first metal layer over the surface of the substrate;
    forming a mask with patterns on the surface of the substrate and within at least an opening partially exposing the first metal layer;
    forming a third metal layer over the exposed surface of the first metal layer by filling the opening of the mask entirely;
    performing an electroplating process to form a second metal layer on top of the third metal layer, wherein the second metal layer and the first metal layer comprise different material;
    forming a protective layer over the surface of the second metal layer and at least a portion of the mask;
    removing the mask with patterns; and
    performing an etching process by utilizing the second metal layer as a mask to remove part of the first metal layer for forming a metal wire.

2. The method of claim 1, wherein the substrate is a TFT array substrate of liquid crystal displays.

3. The method of claim 1, wherein the substrate is comprised of transparent or non-transparent rigid material.

4. The method of claim 1, wherein the first metal layer is formed over the surface of the substrate by utilizing a sputtering process.

5. The method of claim 1, wherein the first metal layer is comprised of a material having strong adhesion to the substrate.

6. The method of claim 5, wherein the first metal layer is comprised of nickel, tantalum, molybdenum, chromium, or aluminum.

7. The method of claim 1, wherein the mask with patterns is a photoresist layer with patterns.

8. The method of claim 7, wherein the photoresist layer with patterns is developed by utilizing a negative film developing process to remove a wire layout pattern formed afterwards.

9. The method of claim 1, wherein the second metal layer is comprised of copper.

10. The method of claim 1, wherein the process of forming the third metal layer is an electroplating process or an electroless plating process.

11. The method of claim 1, wherein the third metal layer is comprised of gold.

12. The method of claim 1 further comprising:
    removing the protective layer after the etching process.

13. The method of claim 12, wherein the protective layer is comprised of tin, such that the protective layer is formed over the surface of the second metal layer via a hot air solder leveling (HASL) process and removed by a tin stripping process.

* * * * *